(12) United States Patent
Gamalski et al.

(10) Patent No.: US 11,522,508 B1
(45) Date of Patent: Dec. 6, 2022

(54) DUAL-BAND MONOLITHIC MICROWAVE IC (MMIC) POWER AMPLIFIER

(71) Applicant: Raytheon Company, Waltham, MA (US)

(72) Inventors: Andrew D. Gamalski, Tucson, AZ (US); Miroslav Micovic, Marana, AZ (US); Katherine J. Herrick, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/402,476

(22) Filed: Aug. 13, 2021

(51) Int. Cl.
*H04B 1/04* (2006.01)
*H03F 1/56* (2006.01)
(Continued)

(52) U.S. Cl.
CPC ............... *H03F 3/245* (2013.01); *H03F 1/56* (2013.01); *H04B 1/04* (2013.01); *H03F 2200/387* (2013.01); *H03F 2200/451* (2013.01)

(58) Field of Classification Search
None
See application file for complete search history.

(56) References Cited

U.S. PATENT DOCUMENTS

| 5,774,017 A | 6/1998 | Adar |
| 6,445,247 B1 * | 9/2002 | Walker ................. H03F 1/0277 330/136 |

(Continued)

FOREIGN PATENT DOCUMENTS

| EP | 2399321 B1 | 3/2019 |
| WO | WO-2001005028 A1 | 1/2001 |

OTHER PUBLICATIONS

Grebennikov, Andrei, "RF and Microwave Transistor Oscillator Design", Chapter 2, (Apr. 13, 2007), pp. 28-29.

*Primary Examiner* — Pablo N Tran
(74) *Attorney, Agent, or Firm* — Schwegman Lundberg & Woessner, P.A.

(57) ABSTRACT

A dual-band MMIC power amplifier and method of operation to amplify frequencies in different RF bands while only requiring input drive signals at frequencies $f_1$ and $f_2$ in a narrow RF input band. This allows for the use of a conventional narrowband RF IC to drive the MMIC and does not require additional circuitry (e.g., a LO) on the MMIC power amplifier. The matching network of the last amplification stage is modified to pass $f_1$ (or a harmonic thereof), reflect $f_2$, pass a $P^{th}$ harmonic of $f_2$ where P is 2 or 3 and to reflect any unused $1^{st}$, $2^{nd}$ or $3^{rd}$ order harmonics of $f_1$ or $f_2$ back into the MMIC. In response to an input signal at $f_1$, the MMIC power amplifier amplifies and outputs a signal at $f_1$ (or a harmonic thereof). In response to an input signal at $f_2$ at sufficient RF power, the last amplification stage operates in compression such that the MMIC power amplifier generates the harmonics, selects the $P^{th}$ harmonic and outputs an amplified RF signal at $P*f_2$.

20 Claims, 7 Drawing Sheets

(51) Int. Cl.
*H03F 3/24* (2006.01)
*H03F 1/22* (2006.01)
*H03F 3/19* (2006.01)

(56) References Cited

U.S. PATENT DOCUMENTS

| | | | |
|---|---|---|---|
| 6,958,649 B2* | 10/2005 | Nagamori | H03G 3/3042 330/285 |
| 7,027,833 B1 | 4/2006 | Goodman | |
| 7,345,534 B2* | 3/2008 | Grebennikov | H03F 3/72 330/51 |
| 7,508,267 B1 | 3/2009 | Yu et al. | |
| 8,989,683 B2 | 3/2015 | Actis et al. | |
| 9,407,214 B2 | 8/2016 | Fribble et al. | |
| 9,871,490 B2* | 1/2018 | Scott | H03F 1/26 |
| 10,340,863 B2* | 7/2019 | Okabe | H03F 3/245 |
| 11,201,595 B2* | 12/2021 | Rogers | H03F 1/22 |
| 11,223,326 B2* | 1/2022 | Schultz | H03F 3/24 |
| 2002/0039047 A1* | 4/2002 | Suzuki | H03F 1/3205 330/133 |
| 2008/0079487 A1* | 4/2008 | Shimada | H03F 3/68 330/277 |
| 2012/0268213 A1 | 10/2012 | Actis et al. | |
| 2017/0163223 A1* | 6/2017 | Shimamoto | H03F 1/56 |

* cited by examiner

DUAL-BAND MONOLITHIC MICROWAVE IC (MMIC) POWER AMPLIFIER

BACKGROUND OF THE INVENTION

Field of the Invention

This invention relates to Monolithic Microwave Integrated Circuit (MMIC) Power Amplifiers, and more particularly to dual-band MMIC Power Amplifiers.

Description of the Related Art

A typical RF transmitter may include an RF IC, a MMIC power amplifier and an antenna. The RF IC modulates a data signal onto an RF carrier signal. The data signal is typically at a relatively low rate e.g. ~1 GHz or ~10% of the center frequency of the RF carrier signal. Typically the RF IC can vary the RF carrier signal over a narrow frequency band e.g., 12-15 GHz or 42-45 GHz. The MMIC amplifies the modulated RF carrier signal to drive the antenna, which transmits the RF signal over the air.

A MMIC power amplifier is a distributed amplifier that is fabricated on a single chip using, for example, GaN, GaAs or SiGe (bipolar transistors or RF CMOS). The distributed amplifier includes a plurality of amplification stages connected in a chain. Each amplification stage includes a transistor biased to provide gain and a matching network (e.g. a lumped element inductor (L)/capacitor (C) or distributed circuit) to allow the amplified RF signal to flow from one amplification stage to the next. The peak-to-peak voltage (a proxy for RF power assuming current is constant) of the signal driven into each amplification stage determines whether that stage operates in its linear or compressed regions. Linear operation provides less distortion of the input signal but less amplified power.

Figure 1:
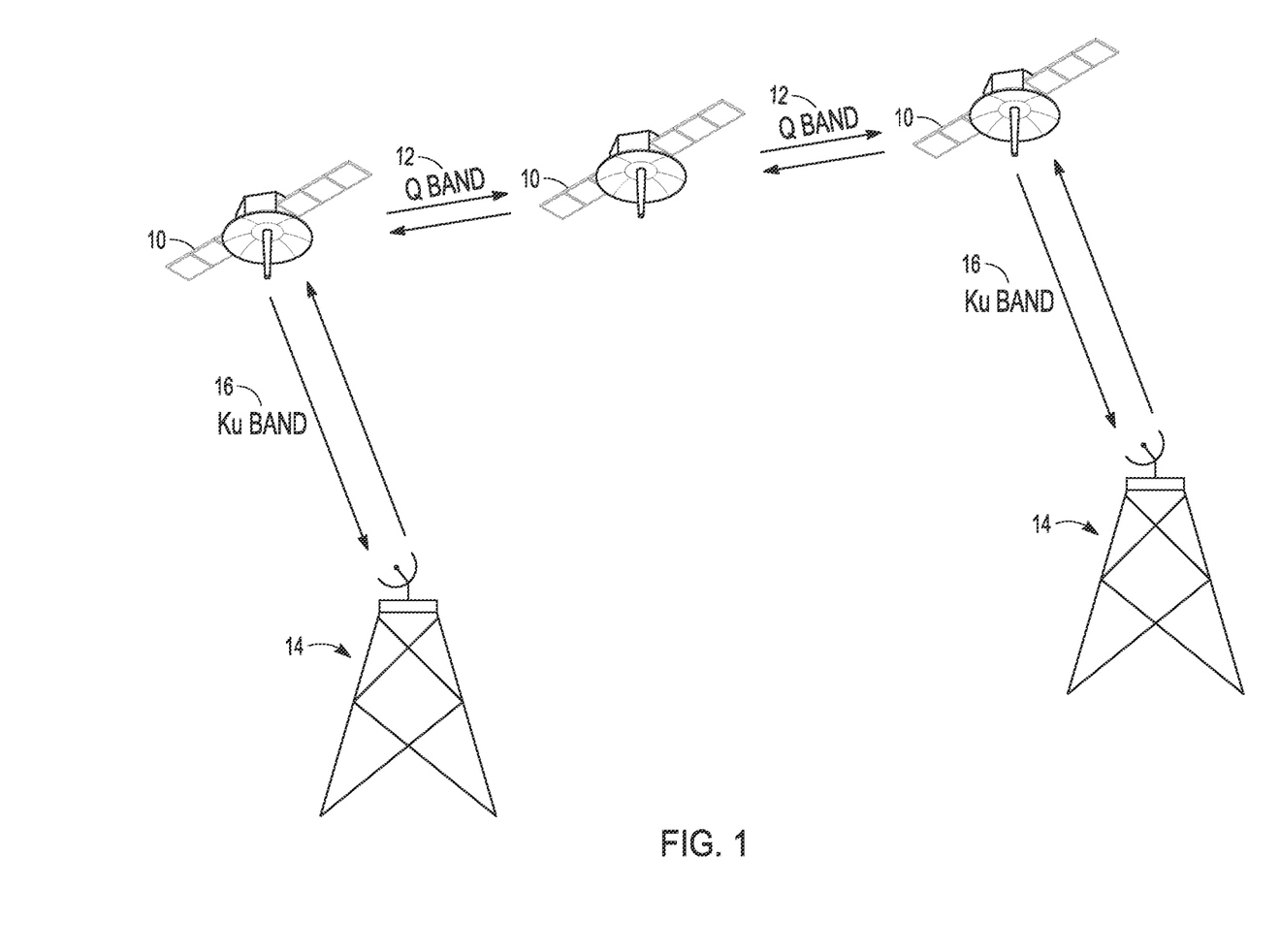
FIG. 1, as described above, illustrates communication between multiple satellites and ground data links over different RF bands in which the satellites communicate between themselves in a higher RF band and with the ground data links in a lower RF band.

In certain applications, it may be required that the RF transmitter have the capability to selectively transmit in multiple, typically dual, RF bands e.g. 16-18 GHz ($K_u$ band) and 33-50 GHz (Q-band). As shown in FIG. 1, a network of satellites 10 communicate with each other in, for example, a 45 GHz band 12 and with ground data links 14 in, for example, a 12 GHz band 16. The lower frequency Ku-band being used to communicate through the atmosphere. The higher frequency Q-band providing higher bandwidth utilized for inter-satellite communication. In such an application the satellites require an RF transmitter that can amplify and transmit RF signals in both the Ku and Q bands.

One approach to realizing a dual band MMIC power amplifier is to have two channels, one MMIC channel that operates in the lower RF band and another MMIC channel that operate in the upper RF band to drive a dual-band antenna. Another approach is to design extremely wideband MMIC power amplifier that spans both the lower and upper bands.

Another approach is to have a MMIC that operates at the lower band and integrate a diode ring and a broadband local oscillator (LO) on the MMIC power amplifier. With this approach the data signal (with a waveform frequency denoted $F_1$) is mixed with the LO (with a waveform frequency denoted $F_2$) generating harmonics using a process called heterodyning. The mixing process generates high and low frequencies $F_1-F_2$ and $F_1+F_2$ (major lowest order mixing components). In most RF devices the low frequency mixed signal $F_1-F_2$ is filtered. The high frequency mixed signal $F_1+F_2$ is then passed to the amplifier and is eventually routed to the antenna where the waveform is radiated into space as the transmission frequency. To vary the transmission frequency $F_1+F_2$ the LO frequency $F_2$ is altered. The frequency of the local oscillator is typically varied by tuning a voltage in the local oscillator denoted $V_{LO}$. Consequently, the output frequency is a function of a voltage in the local oscillator denoted $F_2(V_{LO})$. Since it is possible to vary the input voltage into the local oscillator $V_{LO}$ the output MMIC frequency can be varied thereby effectively creating a dual (or multi) band power amplifier MMIC by the following formula $F_1+F_2(V_{LO})$.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a dual-band MMIC power amplifier configured to receive RF input signals within a narrow input frequency band, amplify and upconvert at least one of the frequencies via a compressed non-linear response of the last amplification stage to output amplified signals in two different frequency bands. This allows for the use of a conventional narrowband RF IC to drive the MMIC and does not require additional circuitry (e.g., a local oscillator) on the MMIC power amplifier.

This is accomplished by modifying the matching network of the last amplification stage and controlling the RF frequencies $f_1$ and $f_2$ and amplitude of the input signals that are driven into the MMIC power amplifier. The matching networks of the first L amplification stages are configured to pass $f_1$ and $f_2$ and to reflect at least the $2^{nd}$ and $3^{rd}$ harmonics thereof. The matching network of the last ($M^{th}$) amplification stage is configured to pass $f_1$ (or a harmonic thereof, namely $N*f_1$ where N=1, 2 or 3) and block $f_2$, to pass a $P^{th}$ harmonic of $f_2$ where P is typically 2 or 3 and to reflect any unused $1^{st}$, $2^{nd}$ or $3^{rd}$ order harmonics of $f_1$ or $f_2$. When the RF IC generates an input signal at $f_1$, the MMIC power amplifier amplifies and outputs a signal at $f_1$ (or a harmonic thereof). When the RF IC generates an input signal at $f_2$ at sufficient RF power, the last amplification stage operates in compression. When a MMIC power amplifier operates in compression it has a non-linear transfer function. This results in the generation of higher-order harmonics of the input signal ($f_2+2f_2+3f_2+\ldots$). The amplifier's matching network is designed such that only one harmonic, denoted the $P^{th}$ harmonic with a frequency $Pf_2$ is amplified and is the signal output from the MMIC. To summarize, in the example above when the MMIC is driven at a frequency $f_1$, an amplified $f_1$ signal is produced by the MMIC. When the MMIC is driven at a frequency $f_2$, an amplified $Pf_2$ is produced by the MMIC.

The RF IC is configured to generate the RF input signal at frequencies $f_1$ and $f_2$ that span a narrow input frequency band. The bandwidth choice is dependent upon the value of the frequencies chosen for amplification and the design of the matching network. At a minimum however, the bandwidth for $f_1$ denoted $2\Delta f_1$ (see: $f_1-\Delta f_1 \leq f_1 \leq f_1+\Delta f_1$) and bandwidth of $f_2$ denoted $2\Delta f_2$ (see: $f_2-\Delta f_2 \leq f_2 \leq f_2+\Delta f_2$) needs to be such that $f_1+\Delta f_1 < f_2-\Delta f_2$. If the previous inequality is not satisfied, then signal leakage will occur across the bands and the matching networks in the device will attenuate or multiply undesired frequencies resulting in signal distortion.

Moreover, the choice of frequencies $f_1$ and $f_2$ and associated bandwidths $2\Delta f_1$ and $2\Delta f_2$ need to be selected so the harmonics correctly pass through the matching networks.

The RF IC may generate the RF input signal at frequency $f_1$ either at low RF power such that the last amplification stage (and all preceding stages) operate in the linear region or at high RF power such that the last amplification stage (and possibly some or all preceding stages) operate in the compressed region. If operating in the linear region, the MMIC power amplifier will output the N=1 harmonic of $f_1$ (i.e., the fundamental frequency). If operating in the compressed region, the MMIC power amplifier may be configured to output $N*f_1$ where N=1, 2 or 3. In this later case, the unused harmonics are reflected back into the transistor to improve power added efficiency.

The matching network of the final amplification stage may be further configured to pass a $Q^{th}$ harmonic of a third input frequency $f_3$ where Q is 2 or 3. The frequencies $f_1$, $f_2$ and $f_3$ are selected and the passbands of the matching network configured such that any unused $1^{st}$, $2^{nd}$ or $3^{rd}$ order harmonics of $f_1$, $f_2$, or $f_3$ are reflected back into the amplification stage. $4^{th}$ or higher order harmonics are naturally attenuated to a point that they do not have to be reflected and add little to the recycled power.

The matching network of the next to last $(M-1^{th})$ amplification stage may be configured to pass $f_1$ (or a harmonic thereof), reflect $f_2$ and pass an $R^{th}$ harmonic of $f_2$ where R is 2 or 3 and to reflect any unused $1^{st}$, $2^{nd}$ or $3^{rd}$ order harmonics of $f_1$ or $f_2$ in order to cascade the higher order harmonics of the $M-1^h$ and $M^{th}$ amplification stages to output an amplified RF signal at a frequency of $R*P*f2$. Cascading of two or more stages allows the MIMIC power amplifier to reach much higher frequencies.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a dual-band MMIC power amplifier configured to receive input signals within a narrow input frequency band, amplify and upconvert at least one of the frequencies via a compressed non-linear response of the last amplification stage to output amplified signals in two different frequency bands. This allows for the use of a conventional narrowband RF IC to drive the MMIC and does not require additional circuitry (e.g., a LO) on the MMIC power amplifier. For example, an RF IC that can generate signals in the $K_u$ band can be configured to drive the dual-band MMIC power amplifier to generate amplified signals in both the $K_u$ and Q bands without modifying the RF IC or adding circuitry to the MMIC.

The difference between the linear and the compressed region depends on the relationship between the input and output voltage from the transistor amplifier. If the relationship between input and output voltage is linear, namely $V_{out}=GV_{in}$ where G is the amplifier gain, then the frequency input is the same as the frequency output if $V_{in}=V_0 \sin(2\pi f_{in}t)$. Now if the relationship between the input and output voltage is nonlinear, namely expressed as a finite or infinite polynomial series $V_{out}=G_1V_{in}+G_2V_{in}^2+G_3V_{in}^3+\ldots$ then passing in a sinusoidal signal through the device as $V_{in}=V_0 \sin(2\pi f_{in}t)$ and using trigonometric product identities (ex: $\sin^2(\alpha)=-(\frac{1}{2})\cos(2\alpha)$) results in $V_{out}$ composed of a sum of sinusoidal function with frequencies that are integer multiples of the input frequency $f_{in}$, $2f_{in}$, $3f_{in}$, …. The power in each of the tones ($f_{in}$, $2f_{in}$, $3f_{in}$, … ) is dependent on the values of the $k^{th}$ power coefficients $G_k$. For most real transistors the $G_k$ coefficients decay in magnitude for higher order tones. Typically $4f_{in}$ and higher order tones are not significant contributors to the total output waveform power. Therefore, driving a MMIC with a single tone waveform at frequency $f_{in}$ in the non-linear region generates an output signal that is composed of a sum of tones that are integer multiples of the input drive frequency $f_{in}$.

For most transistors driven at small RF input powers the voltage input to output response is linear. As the input RF power becomes progressively larger the voltage input to output response curves transition from a linear to a non-linear response (creating what is known as harmonic distortion). This process continues until in the transistor the compression is so extreme that no more gain is possible and the transistor cannot output any more power. Power amplifiers operate at maximum power added efficiency in compression, where some harmonic distortion is generated.

As used herein, when a transistor is described as being driven in the "linear region" it implies that the voltage input to output relationship is approximately linear as the transistor is driven at low power and no spurious tones are generated. When a transistor is described as being driven in "compression" it means the transistor is being driven at high input RF power and the resulting voltage input to output relationship is non-linear. This non-linear input to output voltage relationship generates multiple integer multiples of the input signal frequency in the output signal.

Figure 2:
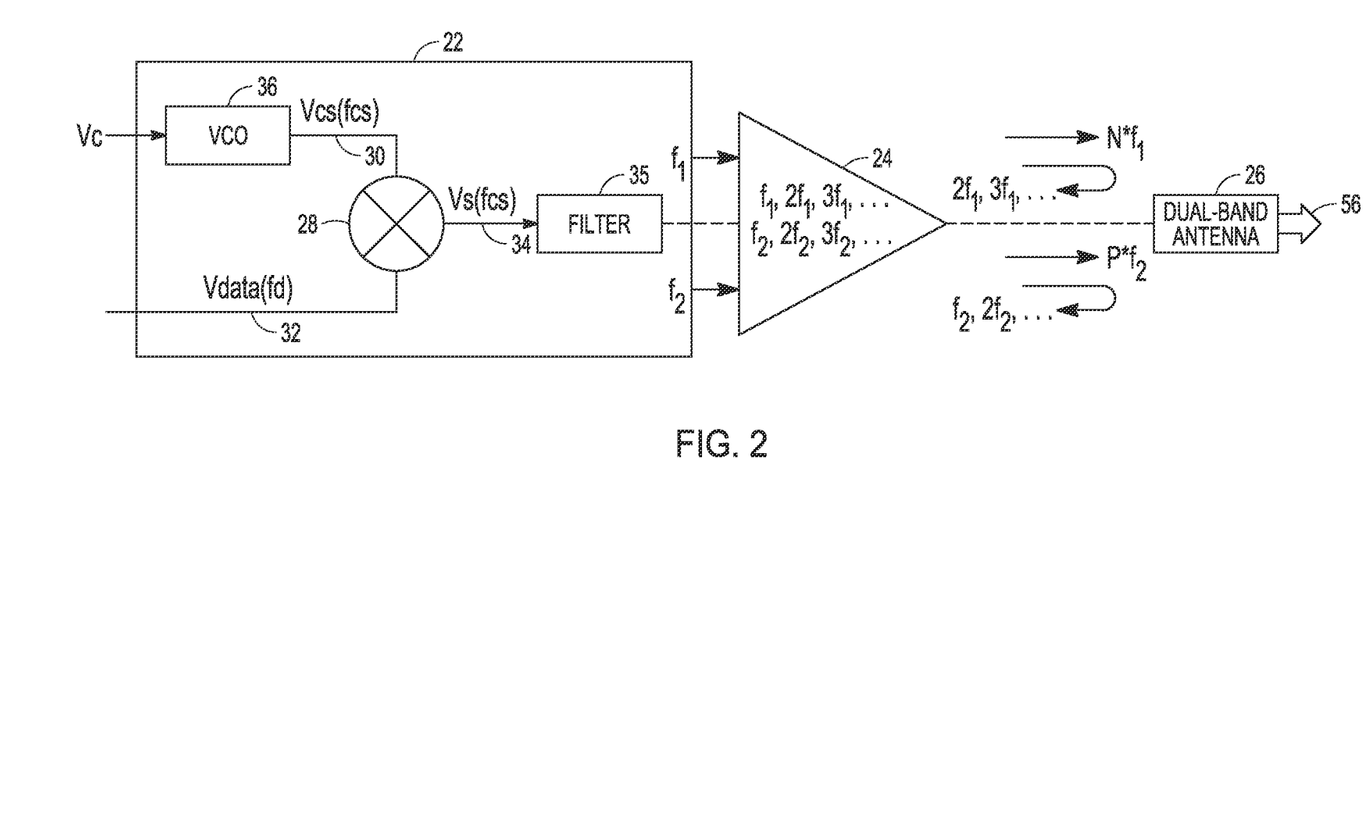
FIG. 2 is a block diagram of an RF transmitter including an RF IC and a dual-band MMIC power amplifier in which the non-linear properties of the transistor in the final stage are used to convert closely spaced frequencies into two amplified output bands at disparate frequencies that are fed into a dual-band antenna.
Figure 3:
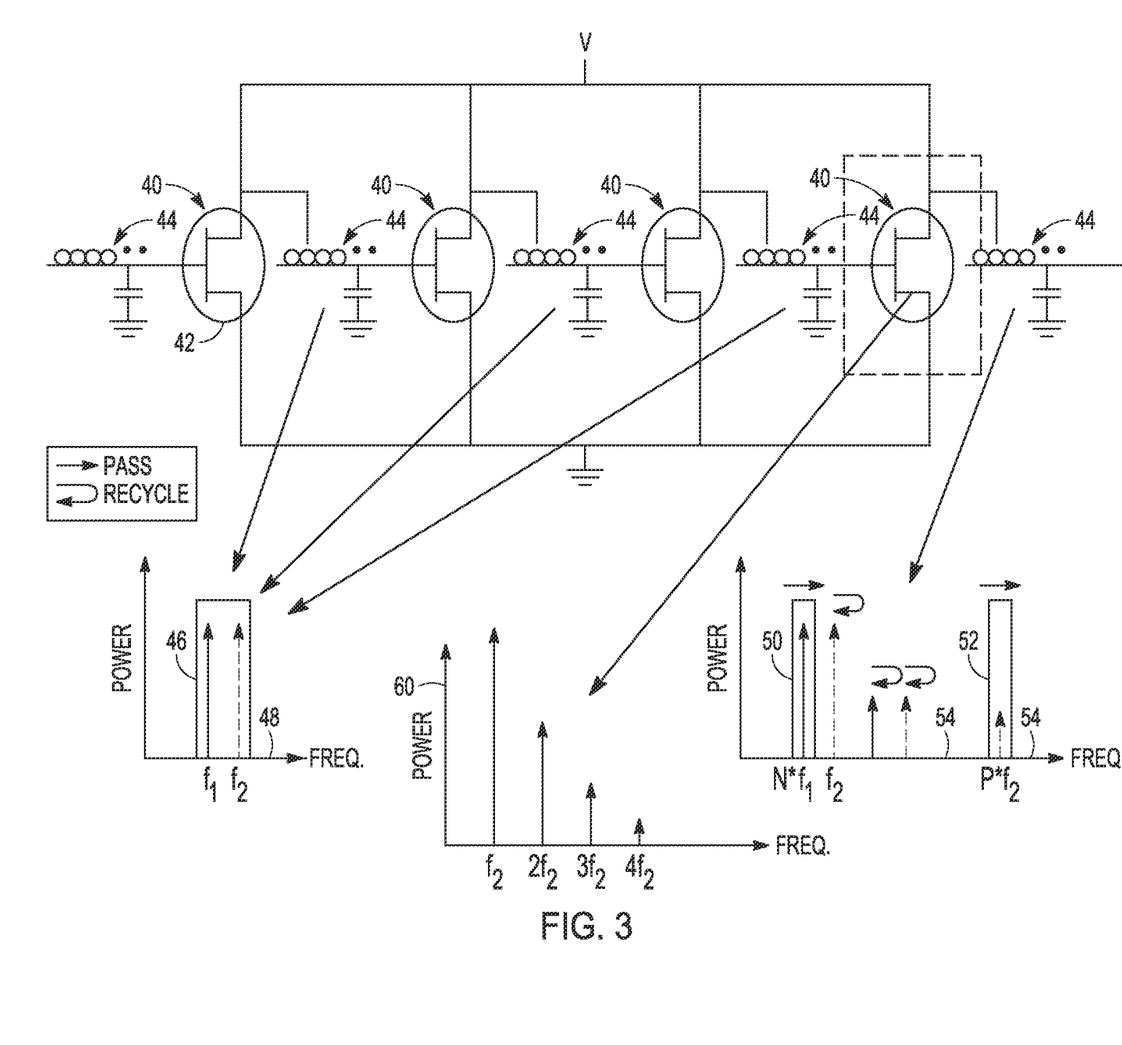
FIG. 3 is a schematic diagram of an embodiment of a 4-stage dual-band MMIC power amplifier in which the matched network of the final amplification stage is configured such that a frequency $f_1$ is amplified and a frequency $f_2$ is amplified with the final amplification stage in compression to amplify a harmonic $P*f_2$.

Referring now to FIGS. 2 and 3, in an embodiment an RF transmitter 20 includes an RF IC 22, a dual-band MMIC power amplifier 24 and a dual-band antenna 26.

A conventional off-the-shelf RF IC 22 (e.g, SiGe or SiGe CMOS) includes a frequency mixer 28 that modulates a carrier signal $V_{cs}(f_{cs})$ 30 with a data signal $V_{data}(f_d)$ 32 to produce a modulated carrier signal $V_s(f_{cs})$ 34 referred to as the RF input signal. A filter 35 removes unwanted frequency products generated by mixer 28. The frequency $f_d$ of the data signal is much lower than the frequency of the carrier signal $f_{cs}$. A control voltage $V_c$ is applied to a voltage controlled oscillator (VCO) 36 to generate carrier signal $V_{cs}(f_{cs})$ 30. By varying control voltage $V_c$, the carrier frequency $f_{cs}$ can be varied over an input frequency band to produce different but closely spaced frequencies $f_1$ and $f_2$.

The RF IC is configured to generate the RF input signal at frequencies $f_1$ and $f_2$ that span a narrow input frequency band. The bandwidth choice is dependent upon the value of the frequencies chosen for amplification and the design of the matching network. At a minimum however, the bandwidth for $f_1$ denoted $2\Delta f_1$ (see: $f_1 - \Delta f_1 \leq f_1 \leq f_1 + \Delta f_1$) and bandwidth of $f_2$ denoted $2\Delta f_2$ (see: $f_2 - \Delta f_2 \leq f_2 \leq f_2 + \Delta f_2$) needs to be such that $f_1 + \Delta f_1 \leq f_2 - \Delta f_2$. If the previous inequality is not satisfied, then signal leakage will occur across the bands and the matching networks in the device will attenuate or multiply undesired frequencies resulting in signal distortion. Moreover, the choice of frequencies $f_1$ and $f_2$ and associated bandwidths $2\Delta f_1$ and $2\Delta f_2$ need to be selected so the harmonics correctly pass through the matching networks.

Dual-band MMIC power amplifier 24 (e.g. GaN, GaAs or SiGe (bipolar junction or RF CMOS devices)) is a distributed amplifier that includes a plurality of M amplification stages 40 operatively coupled in a chain to amplify the RF input signal 34. Each amplification stage 40 includes a transistor 42 biased to provide gain and a matching network 44 to allow the amplified RF input signal to flow from one amplification stage to the next. The matching network is shown as a simple LC circuit but is actually a plurality of lumped parallel-connected LC circuits or distributed matching networks designed to provide certain passband and rejection band characteristics.

The matching networks 44 of the first L<M amplification stages are configured with a passband 46 at the RF input frequency band and a rejection band 48 to reflect at least $2^{nd}$ and $3^{rd}$ order harmonics of the RF input signal. Accordingly, the RF input signal at either $f_1$ or $f_2$ is amplified and flows from one amplification stage to the next. If these intermediate stages are operated in compression mode, the higher order harmonics are reflected back into each stage and the power recycled to increase the power at the fundamental frequency $f_1$ or $f_2$ thereby boosting MMIC power added efficiency.

In accordance with the present invention, the matching network of the $M^{th}$ (last) amplification stage is configured with a first passband 50 at an $N^{th}$ harmonic of $f_1$ where N is 1, 2 or 3 that rejects $f_2$, a second passband 52 at a $P^{th}$ harmonic of $f_2$ where P is 2 or 3, and a rejection band 54 to reflect any unused $1^{st}$, $2^{nd}$ or $3^{rd}$ order harmonics of $f_1$ or $f_2$. It is critical that frequencies $f_1$ and $f_2$ are different frequencies with a certain minimum spacing to avoid overlap of the filter/matching network passbands. $f_1$ and $f_2$ are suitably closely spaced so that they can be generated by an off-the-shelf (OTS) RF IC.

Dual-band antenna 26 suitably includes first and second antenna elements configure to transmit RF signals 56 at $N*f_1$ and $P*f_2$. For example, the antenna may include a pair of patch antennas configured to resonate at $N*f_1$ and $P*f_2$.

For dual-band operation of the RF transmitter, the RF IC 22 selectively generates the RF input signal 34 at frequencies $f_1$ and $f_2$ within the input frequency band.

At frequency $f_1$, the RF input signal 34 is amplified by the transistor 42 at each amplification stage and flows from one stage to the next via matched network 44 through passband 46. At the last or $M^{th}$ amplification stage, the RF input signal is amplified, passes through passband 50 and is output at the $N^{th}$ harmonic $N*f_1$. If the peak-to-peak voltage of the RF input signal applied to the last stage is such that the transistor operates in the linear region than N=1. If the peak-to-peak voltage of the RF input signal (e.g., the RF power) applied to the last stage is such that the transistor operates in the compressed region, the transistor will generate multiple higher order harmonics 60 of the input signal such that N may equal 1, 2 or 3. The MMIC may be configured and driven to operate in compression to maximize the RF transmit power at $f_1$ (i.e. operate at the point of maximum power added efficiency). Alternately, the MMIC may be configured and driven to operate in the linear region to minimize signal distortion. Either is possible at drive frequency $f_1$.

At frequency $f_2$, the RF input signal 34 is amplified by the transistor 42 at each amplification stage and flows from one stage to the next via matched network 44 through passband 46. At the last or $M^{th}$ amplification stage, the RF input signal must have sufficient peak-to-peak voltage (RF power) to compress the transistor and generate the higher order harmonics 60. One of the higher order harmonics (P=2 or 3) passes through passband 52 and is output at the $P^{th}$ harmonic $P*f_2$. The fundamental frequency $f_2$ and the other unused harmonic are reflected by rejection band 54. For the case of N=1, passband 50 is narrower than passband 46 in the preceding stages such that $f_1$ is passed but $f_2$ is rejected.

When driven into compression, the transistor generates the harmonics 60 of the RF input signal. For most transistors used in power amplification, the power in each successive harmonic exhibits a natural decay that is dependent on the transfer function of the specific transistor. To optimize RF output power, it is important that the matching networks are designed to reflect the power of any of the unused harmonics (including the fundamental) back into the transistor. Some of that power will recombine and increase the overall power added efficiency of the MMIC thereby increasing the overall output power of the selected fundamental or harmonic frequency. Any remaining power will be waste heat. However, the natural decay of the power spectrum means reflecting the $4^{th}$ harmonic and higher order tones yields a minimal improvement in device power added efficiency (as there simply isn't that much power in these tones). Therefore, the MMIC power amplifier is limited to generating the fundamental and $2^{nd}$ or $3^{rd}$ harmonics. Simply put, $4^{th}$ and higher harmonics have so little power that engineering the matching network to reflect these harmonics is not necessary.

The dual-band MMIC power amplifier as described is a fixed or 'dumb' device, it merely acts on the RF input signals according to their frequency and power. The design of the dual-band MMIC power amplifier, and particularly the matching network for the last stage, is intimately tied to the selection of the specific input frequencies $f_1$ and $f_2$. Given the complex matching network requirements of the dual-band MMIC, compared to single-band power amplifier MMIC, a narrower input frequency bandwidth around $f_1$ and $f_2$ will be a design compromise. To illustrate how this dual band MMIC architecture will result in reduced bandwidth around $f_1$ and $f_2$ consider what happens as $f_1$ and $f_2$ are varied slightly about their respective center frequencies. Varying $f_1$ may cause the fundamental to be rejected by the last stage instead of amplified and output or may place an unwanted harmonic of $f_1$ in the second passband resulting in distortion of the output signal. Varying $f_2$ may cause the desired $P^{th}$ harmonic to lie outside the second passband resulting in a rejection of the fundamental and harmonics and no output signal. Depending on the tightness of specifications for the passbands and rejection band some small variation in $f_1$ and $f_2$ may be tolerated. Therefore, the design of the matching/filter networks will place constraints on the allowable bandwidth around $f_1$ and $f_2$ (in addition to the natural constraints associated with the performance of the transistors themselves).

Referring now to FIGS. 4A-4C and 5A-B, a dual-band MMIC power amplifier 100 is configured to amplify an RF input signal at frequency $f_1$ and to amplify and upconvert an RF input signal at frequency $f_2$ to $3*f_2$ using the non-linear properties of the compressed final amplification stage. The matching networks for the first M−1 amplification stages are designed to exhibit a passband 102 that passes $f_1$ and $f_2$ within the input frequency band. The matching network for the last or $M^{th}$ amplification stage is designed to exhibit a passband 104 that passes $f_1$ while rejecting $f_2$ and a passband 106 that passes $3*f_2$.

Figures 4A, 4B:
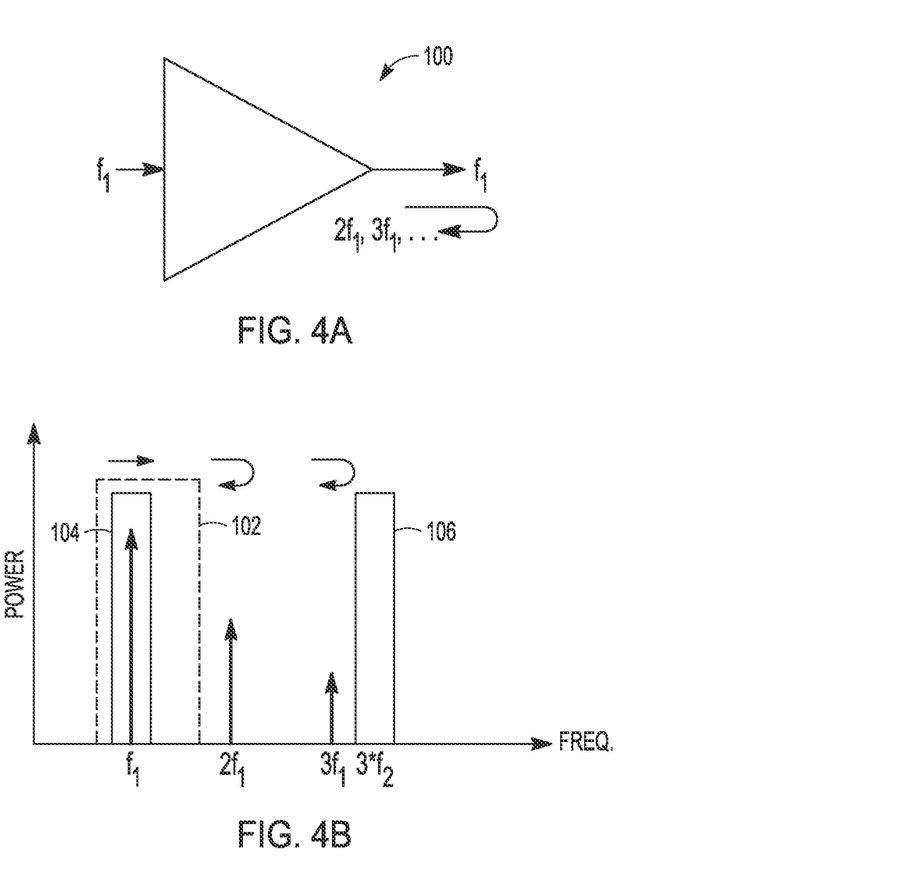
FIGS. 4A-4C are a block diagram and power spectrum plot illustrating the amplification of frequency $f_1$ in both compression and linear regions of operation.

As shown in FIG. 4B, for frequency $f_1$, if the RF input power is sufficient to compress the final stage, harmonics at $f_1$, $2f_1$ and $3f_1$ are generated. $f_1$ is passed through passband 104 while $2f_1$ and $3f_A$ are rejected and recycled. It is critical that passband 106 does not pass either of these unwanted harmonics. This is why $f_2$ must be different than $f_1$ and the frequencies carefully selected to avoid overlap and unwanted filtering and reflection of various frequencies.

Figure 4C:
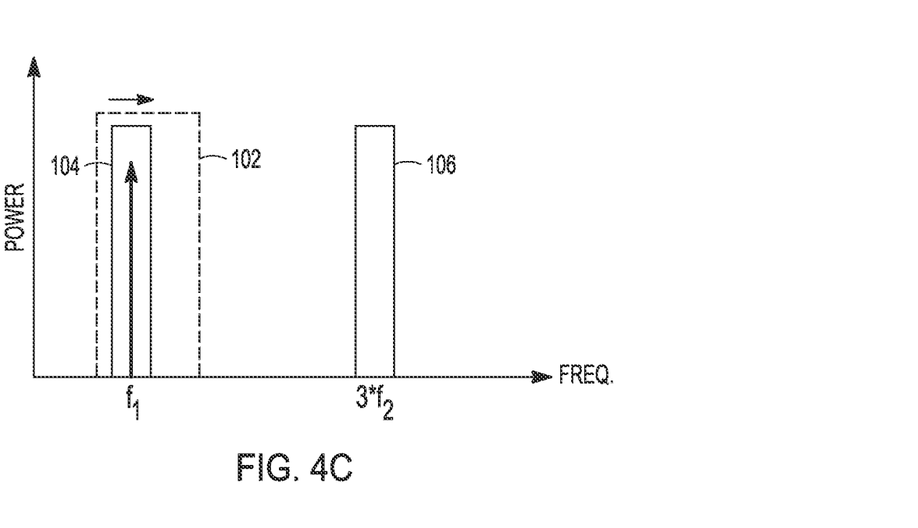

As shown in FIG. 4C, for frequency $f_1$, if the RF input power operates the final stage in its linear region than only the fundamental $f_1$ is generated and passed through passband 104.

Figure 5A:
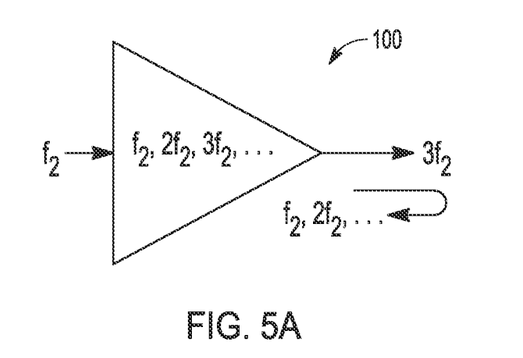
FIGS. 5A-5B are a block diagram and power spectrum plot illustrating the amplification and upconversion of frequency $f_2$ to $P*f_2$.
Figure 5B:
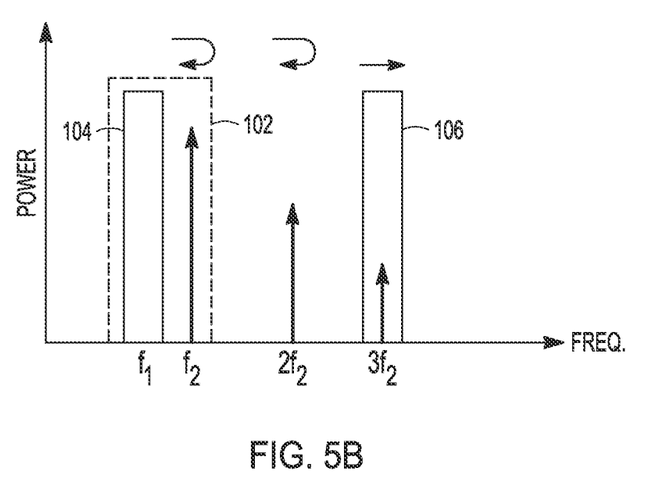

As shown in FIGS. 5A-5B, for frequency $f_2$, the RF input power must be sufficient to compress the final stage and generate harmonics at $f_2$, $2f_2$, $3f_2$ . . . . Although $f_2$ passed through the passband 102 in the preceding M−1 amplification stages it lies outside passband 104 in the final stage and is recycled along with the $2^{nd}$ harmonic $2*f_2$. The $3^{rd}$ harmonic $3*f_3$ passes through passband 106 and is output as the amplified RF signal. Although the $3^{rd}$ harmonic is naturally attenuated, the transitor gain is increased due to the recycled power from the fundamental and second harmonics.

Consider an example using real frequencies: if the input frequency band is the $K_u$ band from 12-18 GHz the RF IC may be configured to generate $f_1$=12 GHz and $f_2$=15 GHz. Passband 102 in the first M−1 stages is configured to pass frequencies between 11 Ghz to 16 GHz. In the final stage passband 104 is configured to pass frequencies from 11 GHz to 13 GHz and passband 106 is configured to pass frequencies from 44 GHz to 46 GHz. Assuming the final stage is compressed for both $f_1$ and $f_2$, $f_1$ will generate harmonics at 12, 24, 36 and 48 GHz and $f_2$ will generate harmonics at 15, 30, 45 and 60 GHz. At $f_1$, the RF input signal is amplified through all M stages producing an amplified RF signal at 12 GHz. At $f_2$, the RF input signal is amplified at 12 GHz through the first M−1 stages. At the final stage, $f_2$ is rejected and recycled into the final stage while the $3^{rd}$ harmonic is amplified and produces an amplified RF signal at 45 GHz.

With only a modification to the matching network of the final amplification stage and careful selection of $f_1$ and $f_2$ in the $K_u$ band, the dual-band MMIC power amplifier can generate an amplified signal in the $K_u$ band and the V band. This is achieved without requiring duplicative channels at the $K_u$ and V band, without requiring an RF IC that supports frequencies across both bands and without additional circuitry on the MMIC.

Figure 6:
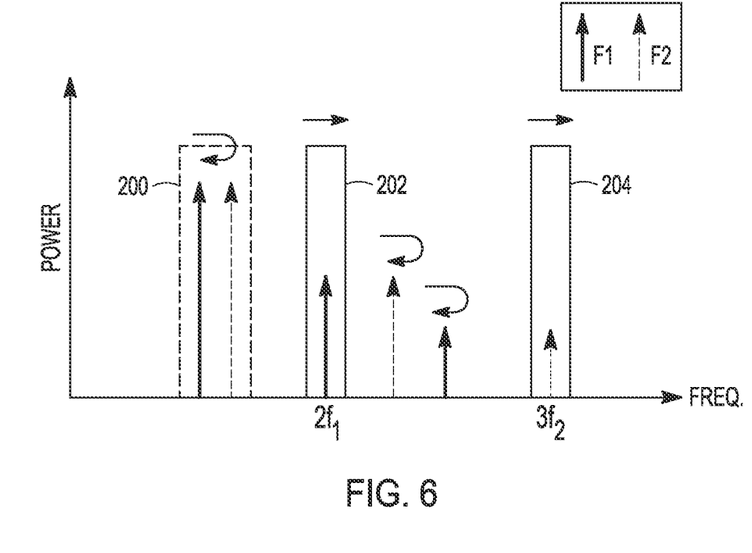
FIG. 6 is a power spectrum plot for an alternative dual-band configuration.

Referring now to FIG. 6, the RF IC and dual-band MMIC power amplifier are configured to amplify and output RF signals at $2*f_1$ and $3*f_2$. As shown, both $f_1$ and $f_2$ pass through a passband 200 in the first M−1 amplification stages. The matching network for the final amplification stage includes a passband 202 at the $2^{nd}$ harmonic of $f_1$ ($2*f_1$) and a passband 204 at the $3^{rd}$ harmonic of $f_2$ ($3*f_2$). In both cases, the RF power of the input signal must be sufficient to compress the transistor in the final amplification stage to generate the higher order harmonics. Furthermore frequencies $f_1$ and $f_2$ must be selected such that the fundamental frequencies and, more particularly, the unused harmonics do not overlap and conflict with passband 204. The unused fundamental and $2^{nd}$ or $3^{rd}$ order harmonics are reflected and recycled to increase the output power of the transistor in the final stage at the desired harmonic of either $f_1$ or $f_2$.

For example, if the input frequency band is the $K_u$ band from 12-18 GHz the RF IC may be configured to generate $f_1$=12 GHz and $f_2$=15 GHz. Passband 200 in the first M−1 stages is configured to pass frequencies between 11 Ghz to 16 GHz. In the final stage passband 202 is configured to pass frequencies from 23 GHz to 25 GHz and passband 204 is configured to pass frequencies from 44 GHz to 46 GHz. The final stage is compressed for both $f_1$ and $f_2$. $f_1$ will generate harmonics at 12, 24, 36 and 48 GHz and $f_2$ will generate harmonics at 15, 30, 45 and 60 GHz. At $f_1$, the RF input signal at 12 GHz is amplified through the first M−1 stages. At the final stage, the fundamental at 12 GHz is reflected (and thus recycled) while the $2^{nd}$ harmonic is amplified and pass through passband 202 producing an amplified RF signal at 24 GHz. At $f_2$, the RF input signal is amplified at 12 GHz through the first M−1 stages. At the final stage, $f_2$ is reflected and recycled into the final stage while the $3^{rd}$ harmonic is amplified and produces an amplified RF signal at 45 GHz. In this configurations, the fundamental frequencies $f_1$, $f_2$, the $3^{rd}$ harmonic of $f_1$ and the $2^{nd}$ harmonic of $f_2$ are reflected and recycled.

Figure 7:
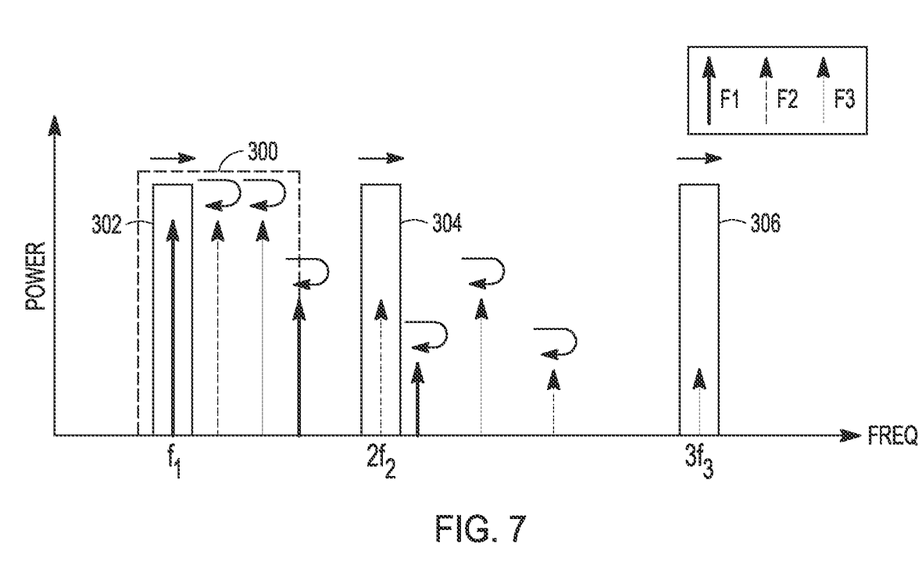
FIG. 7 is a power spectrum plot for a three-band configuration.

Referring now to FIG. 7, the RF IC and dual-band MMIC power amplifier are configured to amplify and output RF signals at $f_1$, $2*f_2$ and $3*f_3$. As shown, each of $f_1$, $f_2$ and $f_3$ pass through a passband 300 in the preceding M−1 amplification stages. The matching network for the final amplification stage includes a passband 302 at $f_1$ that rejects $f_2$ and $f_3$, a passband 304 at the $2^{nd}$ harmonic of $f_2$ ($2*f_2$) and a passband 306 at the $3^{rd}$ harmonic of $f_3$ ($3*f_3$). The last amplification stage must operate in compression for $f_2$ and $f_3$. Furthermore, frequencies $f_1$, $f_2$ and $f_3$ must be selected such that the fundamental frequencies and, more particularly, the unused harmonics do not overlap and conflict with passband 304 and 306. The unused fundamental frequencies and $2^{nd}$ or $3^{rd}$ order harmonics are reflected and recycled to increase the output power of the transistor in the final stage at the desired fundamental or harmonic of either $f_1$, $f_2$ or $f_3$. The addition of a $3^{rd}$ output frequency makes selection of the input frequencies $f_1$, $f_2$ and $f_3$ and the placement/characteristics of the passbands and bandwidth available for the 3 drive tones more demanding than the dual band case.

To illustrate a 3 band MMIC consider it being driven by the RF IC at the following frequencies in $K_u$ band: $f_1$=13 GHz, $f_2$=15 GHz and $f_3$=17 GHz. Passband 300 in the first M−1 stages is configured to pass frequencies between 12 Ghz to 18 GHz.

In the final stage passband 302 is configured to pass frequencies from 12 GHz to 14 GHz, passband 304 is configured to pass frequencies from 29 GHz to 32 GHz and passband 306 is configured to pass frequencies from 50 GHz to 52 GHz. The final stage is compressed for at least $f_2$ and $f_3$. If the MMIC is in compression, $f_1$ will generate harmonics at 13, 26, 39 and 52 GHz, $f_2$ will generate harmonics at 15, 30, 45 and 60 GHz and $f_3$ will generate harmonics at 17, 34, 51 and 68 GHz. At $f_1$, the RF input signal at 13 GHz is amplified through all M stages to output an amplified RF signal at 13 GHz. At $f_2$, the RF input signal is amplified at 15 GHz through the first M−1 stages. At the final stage, $f_2$ is reflected and recycled into the final stage while the 2nd harmonic is amplified and produces an amplified RF signal at 30 GHz. At $f_3$, the RF input signal is amplified at 17 GHz through the first M−1 stages. At the final stage, $f_3$ is reflected and recycled into the final stage, while the $3^{rd}$ harmonic is amplified producing 51 GHz RF signal. Note, the $4^{th}$ harmonic of $f_1$ is at 52 GHz, which may partial pass through passband 306. However, the $4^{th}$ harmonic is naturally attenuated to such an extent that this is unlikely to be a problem. If it is a problem, $f_1$ could be operated in the linear region to avoid the generation of the overlapping $4^{th}$ harmonic.

Figure 8:
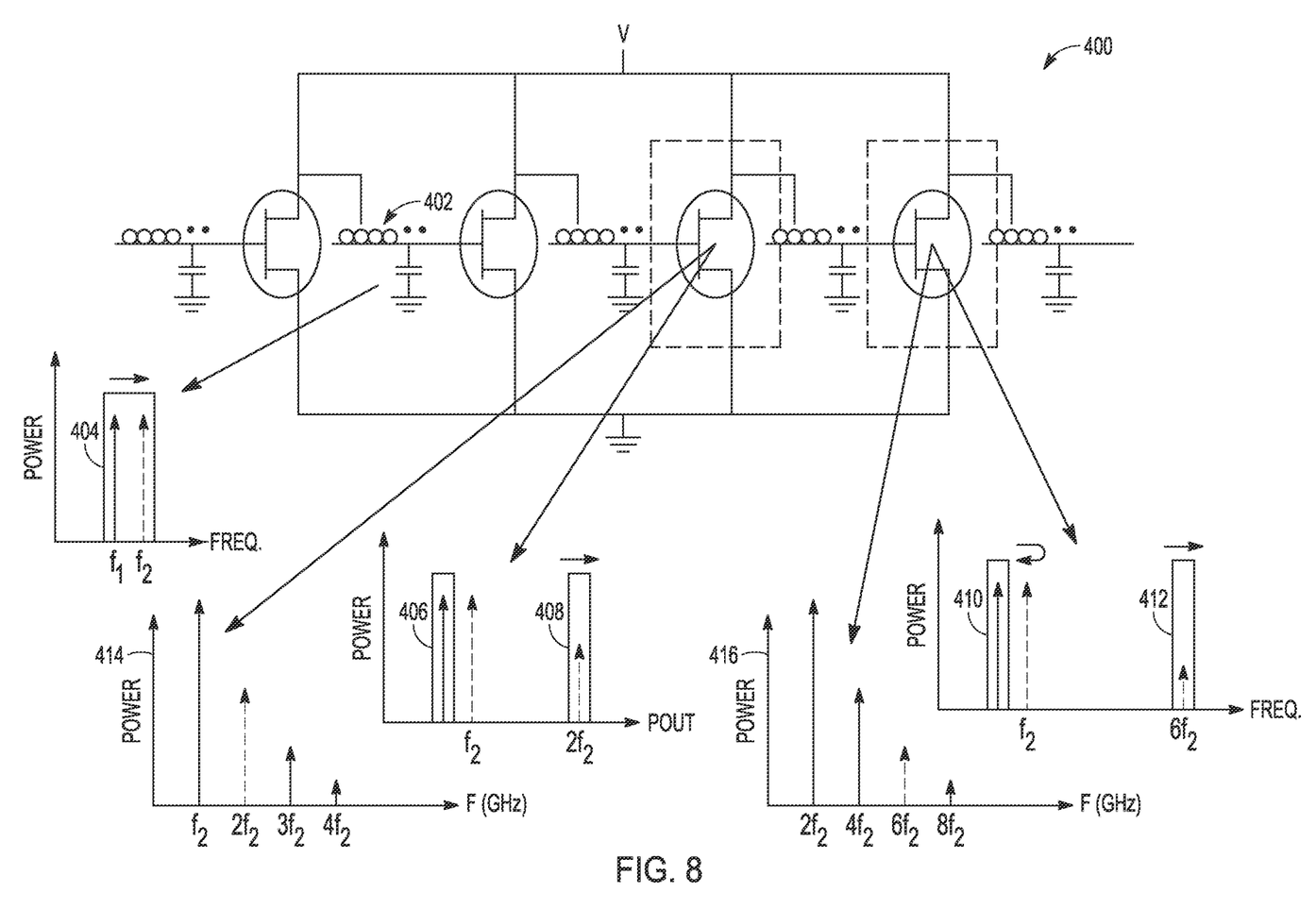
FIG. 8 is a schematic diagram of an embodiment of a 4-stage dual-band MMIC power amplifier in which the matched networks of the next to last and last amplification stages are configured to amplify a frequency $f_1$ and with both stages in compression to cascade the $R^{th}$ and $P^{th}$ harmonics of the stages to amplify a frequency $R*P*f2$.

Referring now to FIG. 8, the RF IC and dual-band MMIC power amplifier 400 are configured to amplify and output RF signals at $f_1$ and $R*P*f_2$ where R=2 and P=3. The matching network 402 in the first M−2 stages is configured to exhibit a passband 404 that spans both input frequencies $f_1$ and $f_2$. The matching network 402 for the M−1 stage is configured to exhibit a passband 406 that passes $f_1$ and reflects $f_2$ and a passband 408 that pass $R*f_2$ where R=2. The matching network 402 for the final $M^{th}$ stage is configured to exhibit a passband 410 that passes $f_1$ and reflects $f_2$ and a passband 412 that passes $R*P*f_2$ where P=3. At $f_1$, the RF input signal is amplified at each stage flowing from one stage to the next through passbands 404, 406 and 410 until being output as the amplified RF signal at $f_1$. At $f_2$, the RF input signal is amplified at $f_2$ by the first M−2 stages. The compressed M−1 stage generates harmonics 414, of which the $2^{nd}$ harmonic is passed through passband 408 and input to the final stage. The compressed final $M^{th}$ stage generates harmonics 416, of which the $3^{rd}$ harmonic at $6*f_2$ is passed through passband 410 and output as the amplified RF signal at $6*f_2$. Cascading the non-linear effects of the last two stages greatly extends the reach of the second band of the dual-band MMIC power amplifier. The natural attenuation of cascading two harmonics will reduce the available output power, a portion of which can be recaptured by recycling the unused harmonics.

For example, if the input frequency band is the C and X band from 6-10 GHz the RF IC may be configured to generate $f_1$=6 GHz and $f_2$=10 GHz. Passband 400 in the first M−2 stages is configured to pass frequencies between 6 Ghz to 10 GHz. In the next to last stage, passband 406 is configured to pass frequencies between 6 GHz and 9 GHz and passband 408 is configured to pass frequencies from 19-21 GHz. In the final stage, passband 410 is configured to pass frequencies between 6-9 GHz and passband 412 is configured to pass frequencies between 59-61 GHz. The final two stages are both compressed for $f_2$. $f_2$ will generate harmonics at 10, 20, 30 and 40 GHz at the M−1 stage and 20, 40, 60 and 80 GHz at the final $M^{th}$ stage. At the M−1 stage, the $2^{nd}$ harmonic at 20 GHz passes through passband 408 to drive the final stage. In turn, the $3^{rd}$ harmonic at 60 GHz passes through passband 412 and is output as the amplified RF signal at 60 GHz.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A dual-band Monolithic Microwave IC (MMIC) power amplifier, comprising:
    an input configured to selectively receive first and second RF input signals that reside at different frequencies $f_1$ and $f_2$ within an RF input frequency band;
    a plurality of M amplification stages operatively in a chain to amplify the RF input signal, each said amplification stage comprising a transistor biased to provide gain and a matching network to allow the amplified input signal to flow from one amplification stage to the next;
    wherein the matching networks of the first L<M amplification stages are configured with a passband at the RF input frequency band and a rejection band to reflect at least $2^{nd}$ and $3^{rd}$ order harmonics of the input signal;
    wherein the matching network of the $M^{th}$ amplification stage is configured with a first passband at an $N^{th}$ harmonic of $f_1$ where N is 1, 2 or 3 that reflects $f_2$, a second passband at a $P^{th}$ harmonic of $f_2$ where P is 2 or 3, and a rejection band to reflect any unused $1^{st}$, $2^{nd}$ or $3^{rd}$ order harmonics of $f_1$ or $f_2$;
    wherein the MMIC is responsive to the RF input signal at $f_1$ to amplify and output an amplified output signal at $N*f_1$;
    wherein the MMIC is responsive to the RF input signal at $f_2$ with sufficient RF power to compress the $M^{th}$ amplification stage to generate and amplify harmonics of the RF input signal to output an amplified signal at $P*f_2$.

2. The dual-band MMIC power amplifier of claim 1, wherein the MMIC power amplifier does include a local oscillator.

3. The dual-band MMIC power amplifier of claim 1, wherein $f_1$ and $f_2$ have bandwidths $2\Delta f_1$ and $2\Delta f_2$, respectively, wherein $f1+\Delta f_1 < f_2 - \Delta f_2$.

4. The dual-band MMIC power amplifier of claim 1, wherein the MMIC is responsive to the RF input signal at $f_1$ at a power to operate the $M^{th}$ amplification stage in its linear region.

5. The dual-band MMIC power amplifier of claim 1, wherein the MMIC is responsive to the RF input signal at $f_1$ at sufficient power to compress the $M^{th}$ amplification stage to generate harmonics.

6. The dual-band MMIC power amplifier of claim 5, wherein N=1 and at least the $2^{nd}$ and $3^{rd}$ order harmonics of the amplified input signal at $f_1$ are reflected back into the transistor at the $M^{th}$ amplification stage.

7. The dual-band MMIC power amplifier of claim 5, wherein N is 2 or 3, and at least the fundamental of the amplified input signal at $f_1$ and the other unused higher order harmonic are reflected back into the transistor at the $M^{th}$ amplification stage.

8. The dual-band MMIC power amplifier of claim 1, wherein the input is configured to selectively receive the RF input signal at frequency $f_3$ within the input frequency band, said matching network of the $M^{th}$ amplification stage further comprises a third passband at a $Q^{th}$ harmonic of $f_3$ where Q is 2 or 3, wherein the rejection band reflects any unused $1^{st}$, $2^{nd}$ or $3^{rd}$ order harmonics of $f_1$, $f_2$ or $f_3$.

9. The dual-band MMIC power amplifier of claim 1, wherein the matching network of the $(M-1)^{th}$ amplification stage is configured with a first passband at an $N^{th}$ harmonic of $f_1$ where N is 1, 2 or 3 that rejects $f_2$, a second passband at a $R^{th}$ harmonic of $f_2$ where R is 2 or 3, and a rejection band to reflect any unused $1^{st}$, $2^{nd}$ or $3^{rd}$ order harmonics of $f_1$ or $f_2$, wherein the second passband of the matching filter network of the M amplification stage is at the R*P harmonic of $f_2$.

10. The dual-band MMIC power amplifier of claim 1, further comprising an RF IC configured to generate and apply the RF input signals within the RF input frequency band and over an RF power range to the input of the MMIC power amplifier.

11. An RF transmitter, comprising:
  a RF IC configured to generate RF input signals within an RF input frequency band and over an RF power range, said IC configured to selective generate first and second RF input signals that reside at different frequencies $f_1$ and $f_2$ within an RF input frequency band;
  a dual-band Monolithic Microwave IC (MMIC) power amplifier comprising a plurality of M amplification stages operatively in a chain to amplify the RF input signal, each said amplification stage comprising a transistor biased to provide gain and a matching network to allow the amplified input signal to flow from one amplification stage to the next, wherein the matching networks of the first L<M amplification stages are configured with a passband at the RF input frequency band and a rejection band to reflect at least $2^{nd}$ and $3^{rd}$ order harmonics of the input signal, wherein the matching network of the $M^{th}$ amplification stage is configured with a first passband at an $N^{th}$ harmonic of $f_1$ where N is 1, 2 or 3 that rejects $f_2$, a second passband at a $P^{th}$ harmonic of $f_2$ where P is 2 or 3, and a rejection band to reflect any unused $1^{st}$, $2^{nd}$ or $3^{rd}$ order harmonics of $f_1$ or $f_2$, wherein the MMIC is responsive to the RF input signal at $f_1$ to amplify and output an amplified output signal at $N*f_1$, wherein the MMIC is responsive to the RF input signal at $f_2$ with sufficient RF power to compress the $M^{th}$ amplification stage to generate and amplify harmonics of the RF input signal to output an amplified signal at $P*f_2$;
  a dual-band antenna having a first antenna element responsive to RF output signals within the first passband and a second antenna element responsive to RF out signals within the second passband to transmit a dual-band RF signal.

12. The RF transmitter of claim 11, wherein $f_1$ and $f_2$ have bandwidths $2\Delta f_1$ and $2\Delta f_2$, respectively, wherein $f1+\Delta f_1 < f_2 - \Delta f_2$.

13. The RF transmitter of claim 11, wherein the MMIC is responsive to the RF input signal at $f_1$ at a power to operate the $M^{th}$ amplification stage in its linear region.

14. The RF transmitter of claim 11, wherein the MMIC is responsive to the RF input signal at $f_1$ at sufficient power to compress the $M^{th}$ amplification stage to generate harmonics.

15. The RF transmitter of claim 14, wherein N=1 and at least the $2^{nd}$ and $3^{rd}$ order harmonics of the amplified input signal at $f_1$ are reflected back into the transistor at the $M^{th}$ amplification stage.

16. The RF transmitter of claim 14, wherein N is 2 or 3, and at least the fundamental of the amplified input signal at $f_1$ and the other unused higher order harmonic are reflected back into the transistor at the $M^{th}$ amplification stage.

17. The RF transmitter of claim 11, wherein the input is configured to selectively receive the RF input signal at frequency $f_3$ within the input frequency band, said matching network of the $M^{th}$ amplification stage further comprises a third passband at a $Q^{th}$ harmonic of $f_3$ where Q is 2 or 3, wherein the rejection band reflects any unused $1^{st}$, $2^{nd}$, or $3^{rd}$ order harmonics of $f_1$, $f_2$ or $f_3$.

18. The RF transmitter of claim 11, wherein the matching network of the $(M-1)^{th}$ amplification stage is configured with a first passband at an $N^{th}$ harmonic of $f_1$ where N is 1, 2 or 3 that rejects $f_2$, a second passband at a $R^{th}$ harmonic of $f_2$ where R is 2 or 3, and a rejection band to reflect any unused $1^{st}$, $2^{nd}$ or $3^{rd}$ order harmonics of $f_1$ or $f_2$, wherein the second passband of the matching filter network of the M amplification stage is at the R*P harmonic of $f_2$.

19. A method of dual-band RF amplification, comprising:
  providing a dual-band Monolithic Microwave IC (MMIC) power amplifier comprising a plurality of M amplification stages operatively in a chain to amplify the RF input signal, each said amplification stage comprising a transistor biased to provide gain and a matching network to allow the amplified input signal to flow from one amplification stage to the next, wherein the matching networks of the first L<M amplification stages are configured with a passband at an RF input frequency band and a rejection band to reflect at least $2^{nd}$ and $3^{rd}$ order harmonics of the input signal, wherein the matching network of the $M^{th}$ amplification stage is configured with a first passband at an $N^{th}$ harmonic of a frequency $f_1$ where N is 1, 2 or 3 that rejects a frequency $f_2$, a second passband at a $P^{th}$ harmonic of frequency $f_2$ where P is 2 or 3, and a rejection band to reflect any unused $1^{st}$, $2^{nd}$ or $3^{rd}$ order harmonics of $f_1$ or $f_2$,
  driving the MMIC power amplifier with an input signal at frequency f1 within the RF input frequency band to amplify and output an amplified output signal at N*f1; and
  driving the MMIC power amplifier with an input signal at frequency f2 within the RF input frequency band with sufficient RF power to compress the $M^{th}$ amplification stage to generate and amplify harmonics of the RF input signal and output an amplified signal at P*f2.

20. The method of claim 19, wherein $f_1$ and $f_2$ have bandwidths $2\Delta f_1$ and $2\Delta f_2$, respectively, wherein $f1+\Delta f_1 < f_2 - \Delta f_2$.

* * * * *

UNITED STATES PATENT AND TRADEMARK OFFICE
CERTIFICATE OF CORRECTION

| | |
|---|---|
| PATENT NO. | : 11,522,508 B1 |
| APPLICATION NO. | : 17/402476 |
| DATED | : December 6, 2022 |
| INVENTOR(S) | : Gamalski et al. |

It is certified that error appears in the above-identified patent and that said Letters Patent is hereby corrected as shown below:

In the Drawings

Sheet 1 of 7, Fig. 1, reference numeral 16, Line 1, delete "Ku BAND" and insert --$K_u$ BAND-- therefor On sheet 1 of 7, Fig. 1, reference numeral 16, Line 1, delete "Ku BAND" and insert --$K_u$ BAND-- therefor On sheet 2 of 7, Fig. 2, and on the title page, the illustrative print figure, reference numeral 30, Line 1, delete "Vcs(fcs)" and insert --$V_{cs}(f_{cs})$-- therefor On sheet 2 of 7, Fig. 2, delete "Vc" and insert --$V_c$-- therefor On sheet 2 of 7, Fig. 2, reference numeral 34, Line 1, delete "Vs(fcs)" and insert --$V_s(f_{cs})$-- therefor On sheet 2 of 7, Fig. 2, reference numeral 32, Line 1, delete "Vdata(fd)" and insert --$V_{data}(f_d)$-- therefor In the Specification In Column 1, Line 43, delete "Ku-band" and insert --$K_u$-band-- therefor In Column 1, Line 48, delete "Ku" and insert --$K_u$-- therefor In Column 3, Line 30, delete "M–1$^h$" and insert --M–1$^{th}$-- therefor In Column 3, Line 31, delete "R*P*f2." and insert --R*P*$f_2$.-- therefor In Column 3, Line 32, delete "MIMIC" and insert --MMIC-- therefor Signed and Sealed this
Twenty-fourth Day of October, 2023

Katherine Kelly Vidal
*Director of the United States Patent and Trademark Office*

CERTIFICATE OF CORRECTION (continued)
U.S. Pat. No. 11,522,508 B1

In Column 3, Line 67, after "and", insert a linebreak

In Column 4, Line 5, delete "R*P*f2." and insert --R*P*$f_2$.-- therefor

In Column 5, Line 23, delete "$f_1+\Delta f_1 \leq f_2 - \Delta f_2$." and insert --$f_1+\Delta f_1 < f_2 - \Delta f_2$.-- therefor In Column 7, Line 28, delete "$3f_A$" and insert --$3f_1$-- therefor In Column 7, Line 45, delete "transitor" and insert --transistor-- therefor In Column 7, Line 52, delete "Ghz" and insert --GHz -- therefor In Column 8, Line 25, delete "Ghz" and insert --GHz-- therefor In Column 8, Line 67, delete "Ghz" and insert --GHz-- therefor In Column 9, Line 13, delete "2nd" and insert --$2^{nd}$-- therefor In Column 9, Line 53, delete "400" and insert --404-- therefor In the Claims In Column 10, Line 41, in Claim 3, delete "f1" and insert --$f_1$-- therefor In Column 11, Line 47, in Claim 12, delete "f1" and insert --$f_1$-- therefor In Column 12, Line 14, in Claim 17, delete "$2^{nd}$," and insert --$2^{nd}$-- therefor In Column 12, Line 41, in Claim 19, delete "f2," and insert --$f_2$;-- therefor In Column 12, Line 43, in Claim 19, delete "f1" and insert --$f_1$-- therefor In Column 12, Line 44, in Claim 19, delete "N*f1;" and insert --N*$f_1$;-- therefor In Column 12, Line 47, in Claim 19, delete "f2" and insert --$f_2$-- therefor In Column 12, Line 50, in Claim 19, delete "P*f2." and insert --P*$f_2$.-- therefor In Column 12, Line 52, in Claim 20, delete "f1" and insert --$f_1$-- therefor